United States Patent [19]
Zenke

[11] Patent Number: 5,441,594
[45] Date of Patent: Aug. 15, 1995

[54] METHOD OF MANUFACTURING SEMICONDUCTOR DEVICE

[75] Inventor: Masanobu Zenke, Tokyo, Japan

[73] Assignee: NEC Corporation, Japan

[21] Appl. No.: 22,722

[22] Filed: Feb. 24, 1993

[30] Foreign Application Priority Data

Feb. 28, 1992 [JP] Japan .................................. 4-044119

[51] Int. Cl.[6] ...................... H01L 21/306; B44C 1/22; C23F 1/00; C03C 15/00
[52] U.S. Cl. ..................... 156/643.1; 134/31; 437/228; 437/235; 437/187
[58] Field of Search ............... 156/625, 644, 646, 643, 156/656, 657, 659.1, 662; 437/225, 228, 235, 238, 241, 187; 134/1, 31

[56] References Cited

U.S. PATENT DOCUMENTS 5,022,961  6/1991  Izumi et al. ...................... 156/646
5,089,441  2/1992  Moslehi .............................. 437/225

OTHER PUBLICATIONS

"Ultrathin silicon nitride films prepared by combining rapid thermal nitridation with low-pressure chemical vapor deposition", K. Ando and A. Ishitani, Appl. Phys. Lett. 59(9), 26 Aug. 1991, pp. 1081-1083.

"Low Damage Magnetron Enhanced Reactive Ion Etching", Masayuki Sato, et al., Extending Abstracts of the 1991 International Conference on Solid State Devices and Materials, Yokohama, 1991, pp.225-227.

*Primary Examiner*—William Powell
*Attorney, Agent, or Firm*—Laff, Whitesel, Conte & Saret, Ltd.

[57] ABSTRACT

A contact hole reaching a diffusion layer 2 provided on the surface of a silicon substrate 1 is formed by etching an insulating film 3. At this time, a surface layer 2a formed on the surface of the diffusion layer 2 is removed within a film forming unit by utilizing chlorine trifluoride gas. Next, a polycrystalline silicon film 4 is formed within tile same film forming equipment. Thus, the surface of an electrically conductive layer (including a semiconductor layer) covered with the insulating film is selectively exposed by the etching process and, prior to the formation of the film (including oxidized layer), connected to the exposed surface of the electrically conductive layer, the surface layer formed on the surface of the electrically conductive layer, which includes a naturally oxidized film, damage, contaminated substances or the like, can be completely removed.

10 Claims, 11 Drawing Sheets

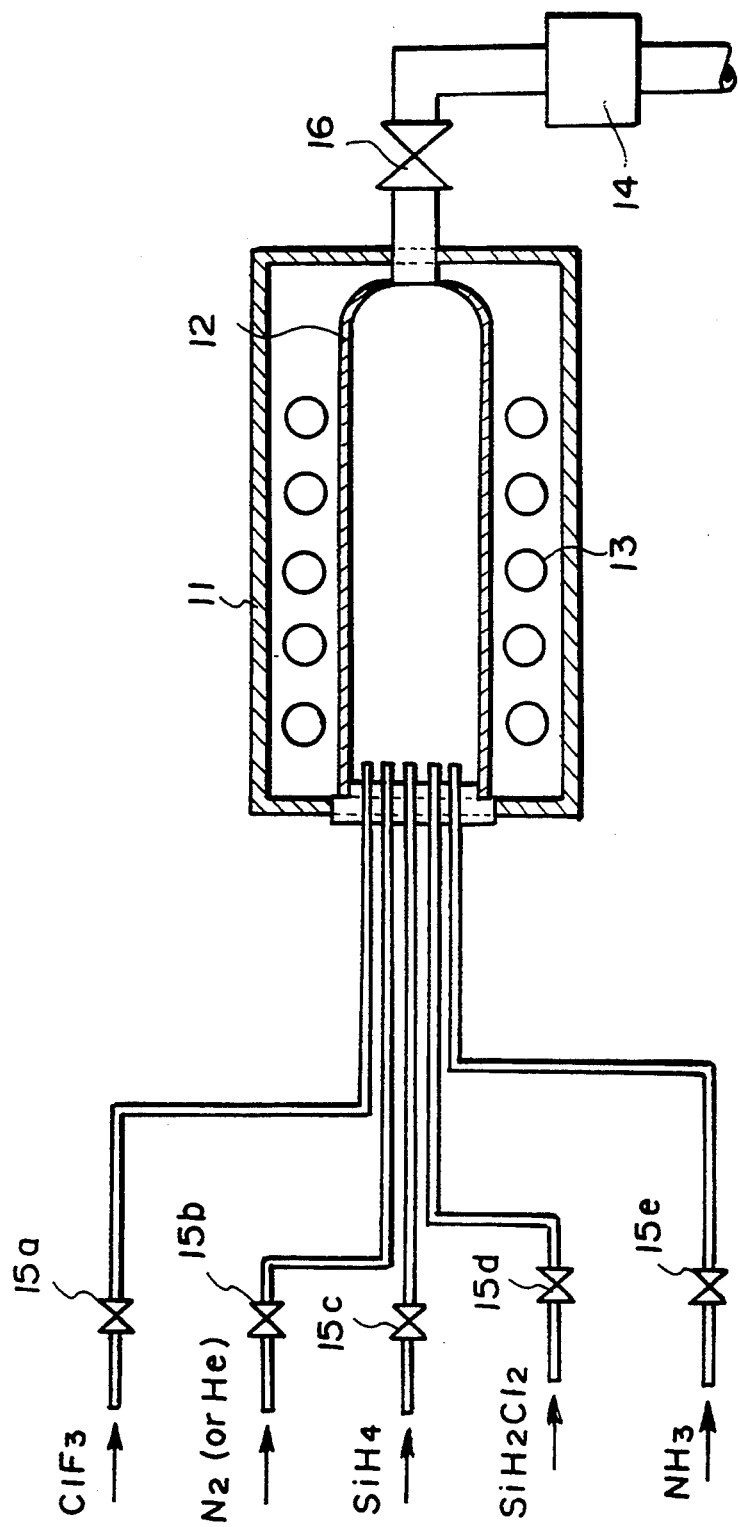

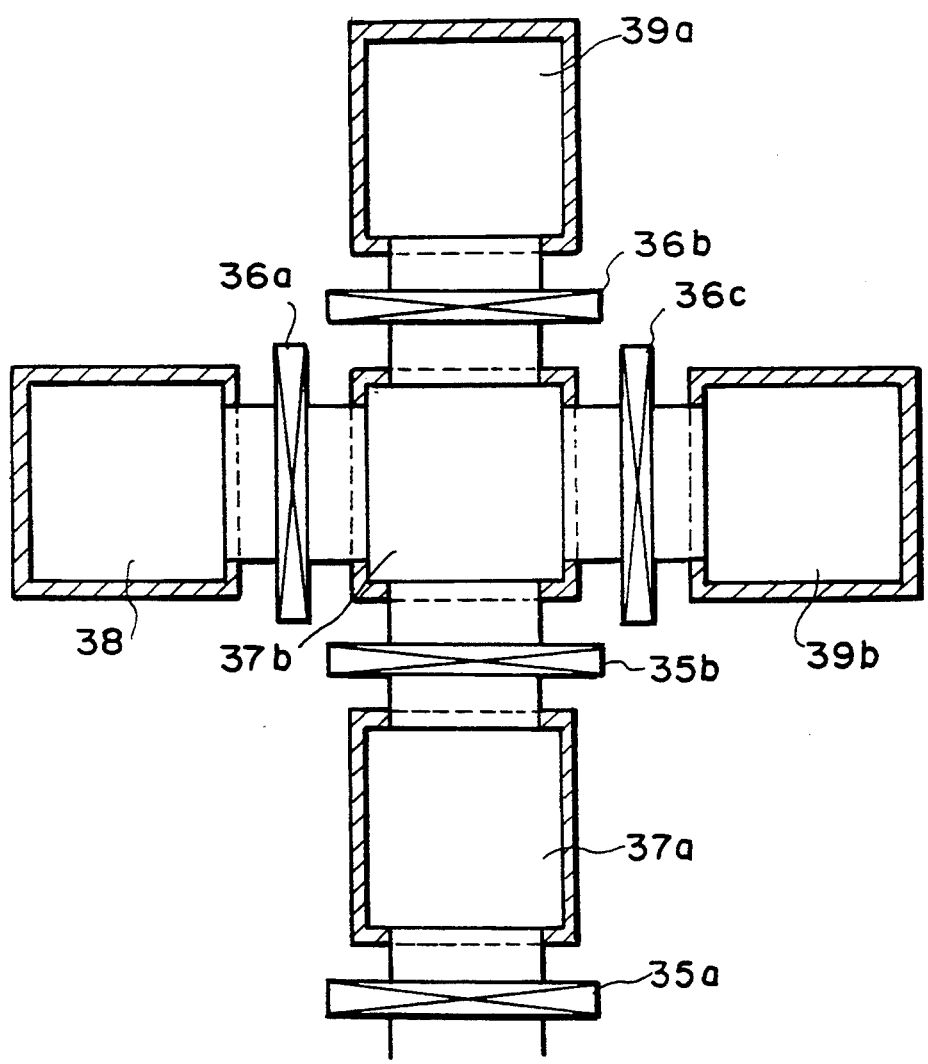

METHOD OF MANUFACTURING SEMICONDUCTOR DEVICE

FIELD OF THE INVENTION

The present invention relates to a method of manufacturing a semiconductor device. In particular, the present invention is suitably applied to a method of manufacturing semiconductor device comprising an etching process.

BACKGROUND OF THE INVENTION

Conventionally, in the method of manufacturing semiconductor device, at least part of the surface of the electrically conductive layer (including a semiconductor layer) has been exposed by the etching process and, a film (including oxide film) is deposited on this exposed surface of the conductive layer. Prior to such film deposition, washing and rinsing with water are conducted, for example, after a photoresist is removed. If an underlying metallic film is exposed, as in the through hole process, then the photoresist is removed, the rest is rinsed with an organic solvent and the surface of the underlying metallic film may be sputter etched (reversely sputtered) by argon gas or the like within a sputtering equipment.

A conventional method of manufacturing semiconductor device is hereinafter described with reference to the accompanying drawings. FIG. 1 is a cross-sectional view illustrating a process of the conventional method. FIG. 2 is a cross-sectional view illustrating a process of the conventional method. FIGS. 3A through 3C are respectively a cross-sectional view illustrating the processes according to the conventional method in the order in which they are followed. FIG. 4 is a cross-sectional view illustrating a process of the conventional method.

First, as illustrated in FIG. 1, an n+-type diffusion layer 62 is formed on the surface of a p-type silicon substrate 61, an insulating film 63 having the thickness of about 0.5 through 1.0 $\mu$m comprising, for example, a silicon oxide film is formed on its entire surface, a contact hole reaching the diffusion layer 62 is formed on the insulating film 63 by plasma etching taking the photoresist as a mask and the photoresist is removed by ashing by oxygen plasma. At this time, a surface layer 62a having the thickness of about 2 through 5 nm is formed on the surface of the diffusion layer 62 exposed at the contact hole. The surface layer 62a is mainly comprised of a naturally oxidized film, and is damaged by the effect caused by the plasma etching as the contact hole is formed and the plasma ashing as the photoresist is removed. Further, this surface layer 62a contains contaminated substances such as a heavy metal and hydrocarbon polymer (($CH_2$)$_n$ : n is positive integer) and the like, as added when the photoresist is removed. Next, a polycrystalline silicon film 64a having the thickness of about 0.5 $\mu$m is formed by thermal decomposition reaction of monosilane ($SiH_4$), with the nitrogen gas as a carrier gas, within an LPCVD equipment. Subsequently, it is taken out of the LPCVD equipment and the polycrystalline silicon film 64a is turned into n+-type by the thermal diffusion of the phosphor or the like and is etched by the photolithography process, to form an interconnection made of the polycrystalline silicon film 64a.

Next, as illustrated in FIG. 2, in the conventional method of forming the through hole for multiple layer interconnection, an insulating film 73a having the thickness of about 0.5 through 1.0 $\mu$m comprising, for example, a silicon oxide film is formed on a p-type silicon substrate 71, and an n+-type polycrystalline silicon film 74 having the thickness of about 0.1 through 0.2 $\mu$m is formed on the entire surface of the insulating film 73a. Further, a tungsten silicide film 79 having the thickness of about 0.1 through 0.2 $\mu$m is formed on the entire surface of the polycrystalline silicon film 74 by sputtering. These are patterned to form a lower layer interconnection comprising the n+-type polycrystalline silicon film 74 and the tungsten silicide film 75. Next, by the CVD method, an insulating film 73b having the thickness of about 0.9 $\mu$m, which comprises, for example, a silicon oxide film, is formed on the entire surface, a through hole reaching the tungsten silicide film 75 is formed through the insulating film 73b by the plasma etching, with the photoresist as the mask, and the photoresist is removed by the ashing by oxygen plasma. At this time, a surface layer 75a having the thickness of about 2 through 5 nm is formed on the surface of the tungsten silicide film exposed at the through hole. This surface layer 75a is mainly comprised of a naturally oxidized film, as in the foregoing surface layer 62a, and is damaged by the effect caused by the plasma etching and the plasma ashing. Further, this surface layer 75a contains contaminated substances such as heavy metals, hydrocarbon polymers or the like. Next, within the sputtering equipment, a metallic film having the thickness of about 0.5 $\mu$m comprising, for example, an aluminum film, tungsten film or the like is deposited on the entire surface. Subsequently, it is taken out of the sputtering equipment and the metallic film is etched by the photolithography process to form the upper layer interconnection 76.

Next, as illustrated in FIG. 3A, in the conventional method of forming a capacitor dielectric for a DRAM, an n+-type diffusion layer 82 is formed on the surface of the p-type silicon substrate 81 and an insulating film 83 having the thickness of about 0.5 through 0.7 $\mu$m, which comprises, for example, a silicon oxide film, is formed on the entire surface. Further, a contact hole reaching the diffusion layer 82 is formed on the insulating film 83 and a polycrystalline silicon film (not shown) having the thickness of about 0.4 $\mu$m is formed on the entire surface by the thermal decomposition reaction of the monosilane using the LPCVD equipment, Next, it is taken out of the LPCVD equipment, and the polycrystalline silicon film is turned into the n+-type by the thermal diffusion of the phosphor and the like and is etched by the plasma etching with the photoresist as the mask. Subsequently, the photoresist is removed by ashing by oxygen plasma to form a storage node electrode 84 comprising the polycrystalline silicon film. At this time, a surface layer 84a having the thickness of about 2 through 5 nm is formed on the surface of the storage node electrode 84. This surface layer 84a also mainly comprise's a naturally oxidized film, as in the surface layer 62a of FIG. 1, and is damaged to contain the contaminated substances such as the heavy metal, hydrocarbon polymer and the like.

Next, as illustrated in FIG. 3B, within the LPCVD equipment, a silicon nitride film 87 having the thickness of about 5 through 10 nm is entirely formed by the gas phase chemical reaction of the dichlorosilane ($SiH_2Cl_2$) and ammonia gas ($NH_3$) with the nitrogen gas as carrier gas.

Next, as illustrated in FIG. 3C, within the same or another LPCVD equipment, a polycrystalline silicon film having the thickness of about 0.4 μm is formed by the thermal decomposition reaction of the monosilane with the nitrogen gas as carrier gas. Subsequently, it is taken out of the LPCVD equipment, the polysilicon film is turned into the n+-type by the thermal diffusion of the phosphor or the like, and the polycrystalline silicon film and the silicon nitride film 87 are etched by the photolithography process to form a plate electrode 86 comprising a polycrystalline silicon film and a capacitor dielectric 87a comprising the silicon nitride film.

Next, as illustrated in FIG. 4, in the conventional method of forming a gate oxide film, a pad oxide film (not shown) and a silicon nitride film (not shown) are formed on the surface of the p-type silicon substrate 91, and a field oxide film 93 having the thickness of about 0.6 through 0.8 μm is formed according to a known selective oxidizing method and the silicon nitride film and the pad oxide film are removed by etching to expose the part of the surface of the silicon substrate 91 which corresponds to the area for forming the element. At this time, a surface layer (not shown) is formed on the exposed surface of the silicon substrate 91. This surface layer has the thickness of about 2 nm and contains contaminated substances such as the carbon compounds or the like. Next, within the thermal oxidizing furnace, a gate insulating film 98 having the thickness of about 15 nm, which comprises a silicon oxide film, is formed on the exposed surface of the silicon substrate 91 by the reaction between the hydrogen gas ($H_2$) and the oxygen gas ($O_2$) with the nitrogen gas or helium gas as carrier gas. At this time, a pit-shaped cavity is formed on the gate insulating film 98. This cavity is produced because, by the generation of the silicon carbide caused by the reaction between, for example, the carbon and the silicon, oxidization of the surrounding silicon is impeded. Next, a gate electrode 99 comprising an n+-type polycrystalline silicon film is formed, and n+-type diffusion layers 92a, 92b, which serve as the source area and the drain area respectively, are formed to form a MOS transistor.

However, in the conventional method of manufacturing semiconductor device, when after at least part of the surface of the conductive layer (including the semiconductor layer) is exposed by the etching process the film (including the oxide film) connected to the exposed surface of the conductive layer is formed, since the foregoing method and the film forming unit are adopted, the surface layer formed according to the exposure of the surface of the conductive layer cannot completely be removed, and the presence of this surface layer causes various disadvantages.

These various disadvantages are specifically described. These surface layers undergo the damage caused by the plasma, and further includes the contaminated substances such as the heavy metals, carbon compounds and the like, and is mainly composed of the naturally oxidized film.

For the contact hole, the presence of the naturally oxidized film causes the contact resistance to be increased, and causes a problem especially for the fine contact hole smaller than 0.4 μm in each side of its square. Further, if the surface layer is damaged or is contaminated by the heavy metal, then the contact leak current is increased, and the presence of the heavy metal causes generation of the crystalline defects.

Further, for the through hole, the presence of the naturally oxidized film causes the contact resistance to be increased, as in the contact hole, and the presence of the damage and the contamination causes reduction of the long-term reliability. In this case, as described above, prior to deposition of the metallic film of the upper layer interconnection by the sputtering equipment, it is possible to remove the surface layer of the lower layer interconnection by argon sputtering or the like so that the increase of the contact resistance can be alleviated. However, this sputter etching or reverse sputtering causes generation of the damage and adhesion of the contaminated substance, which causes a new surface layer to be formed leading to no complete solution in the aspect of the long-term reliability.

For the capacitor dielectric in the DRAM, if the naturally oxidized film is present, then the capacitance is lowered, and the presence of the damage and the contamination causes deterioration of the reliability such as inferior voltage-proof performance and the increase of the leak current of the capacitive insulating film or the like.

Further, for the gate insulating film, the thickness of the surface layer comprising the naturally oxidized film is thinner than in other cases, but the presence of the contamination causes a serious problem. For example, if the oxidized silicon film is included within the contaminated surface layer lying on the gate insulating film, a factor of a shape depending on the pit-shaped cavity or the like and the contaminated substances form a leak path causing deterioration of the reliability such as the inferior voltage-proof performance.

SUMMARY OF THE INVENTION

In view of the foregoing circumstances, the present invention was made, and its object is to provide a method of manufacturing semiconductor device in which at least part of the surface of the conductive layer (including the semiconductor layer) is exposed by etching or the like, and prior to the formation of a film (including the oxidized layer) connected to the surface of this exposed conductive layer, the surface layer including the naturally oxidized film, damage and contaminated substances and the like, which is formed on the surface of the exposed conductive layer, is completely removed.

The method of the present invention comprises steps of: removing by chlorine trifluoride gas a surface layer formed on the exposed surface of an electric conductor, where no insulating film is formed when the insulating film is selectively formed on the electric conductor lying on the semiconductor substrate; and forming a film connected to the electric conductor on at least the exposed surface thereof.

In the present invention, the selective formation of the insulating film on the electric conductor may be achieved by forming the insulating film on the surface of the electric conductor and removing part of the insulating film by etching. Here, the etching may be done by plasma etching and the surface layer may be formed accompanied by the etching.

In the present invention, the step of removing the surface layer by the chlorine trifluoride gas and the step of forming a film connected to the electric conductor may be carried out within the same apparatus.

In the present invention, the insulating film may be lie between a semiconductor and an interconnection layer or between the interconnection layers.

In the present invention, the insulating film may comprises a capacitor dielectric or a field oxide film of the semiconductor.

In the present invention, the film connected to the electric conductor may have an electrically conductive or insulating performance.

In the present invention, the film connected to the electric conductor may comprise a gate insulating film of a MOS transistor.

In the present invention, the semiconductor substrate having the insulating film formed on the electrically conductive layer is etched to selectively expose the surface of the electrically conductive layer. On the exposed surface of the electrically conductive layer, the surface layer is formed. Prior to formation of the film connected to the exposed surface of the electrically conductive layer, the foregoing surface layer is removed within the film forming equipment by the chlorine trifluoride gas and, thereafter, the film connected to the electrically conductive layer is formed by means of the same film forming equipment. In consequence, no surface layer is interposed between the electrically conductive layer and the film connected to the surface of the electrically conductive layer. In consequence, the increase of the contact resistance and the reduction of the long-term reliability, which are generated by the interposed surface layer, can be avoided.

Thus, according to the present invention, various disadvantages caused by the interposed surface layer including the naturally oxidized film, damage, contaminated substances or the like, such as the increase of the contact resistance, reduction of the capacity value, increase of the leak current and reduction of the voltage-proof performance, can be avoided.

BRIEF DESCRIPTION OF THE ACCOMPANYING DRAWINGS

FIG. 5 is a schematic view of a film forming equipment used in a specific example of the method according to the present invention;

FIG. 6 is a schematic view illustrating another film forming equipment used in the specific example of the method according to the present invention;

DETAILED DESCRIPTION OF THE PREFERRED EMBODIMENTS

Figure 1:
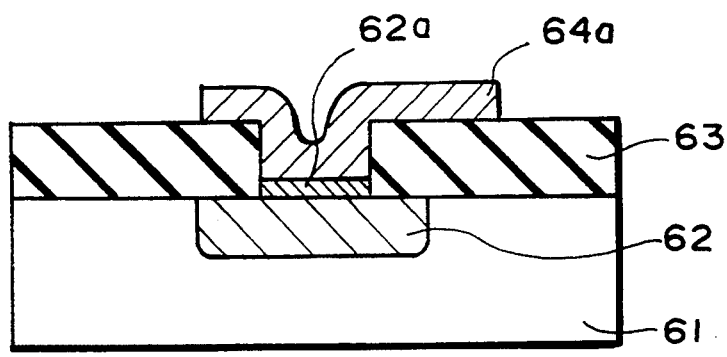
FIG. 1 is a cross-sectional view illustrating a process in a conventional method of manufacturing semiconductor device.
Figure 2:
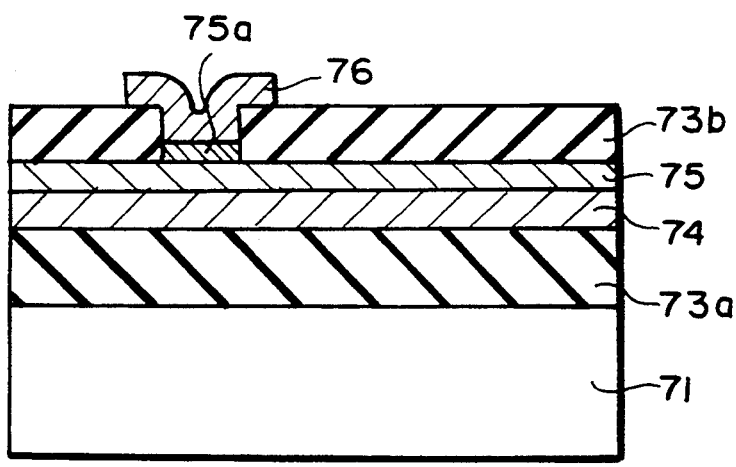
FIG. 2 is a cross-sectional view illustrating a process in the conventional method of manufacturing semiconductor device.

Next, several embodiments of the present invention are concretely described with reference to the accompanying drawings, but it should be understood that they do not restrict the scope of the present invention.

First, a film forming equipment used for practicing the method according to the present invention is described. FIG. 5 is a schematic view of the film forming equipment used in the method according to the present invention. FIG. 6 is a schematic view of another film forming equipment used in the method according to the present invention.

The film forming equipment as illustrated in FIG. 5 has a means for etching by chlorine trifluoride gas ($ClF_3$). This chlorine trifluoride gas is effective for etching polycrystalline silicon and metals such as tungsten, molybdenum or the like, and can be used for cleaning by etching the polycrystalline silicon, tungsten, molybdenum and the like adhered to the inner surface of the film forming equipment such as a furnace core tube for forming the polycrystalline silicon film, tungsten film, molybdenum film and the like. The film forming equipment used in the present invention utilizes the foregoing characteristics of the chlorine trifluoride gas.

As illustrated in FIG. 5, the film forming equipment used in the present invention comprises an LPCVD equipment which allows etching by the chlorine trifluoride gas ($ClF_3$) within a quartz chamber 12, formation of the polycrystalline silicon film by the thermal decomposition reaction of the monosilane ($SiH_4$) and formation of the silicon nitride film caused by the gas phase chemical reaction between the dichlorosilane ($SiH_2Cl_2$) and the ammonia gas ($NH_3$).

A quartz chamber 12 is provided within a furnace body 11 and is heated by means of a heating lamp 13. A chlorine trifluoride gas, a carrier gas comprising nitrogen gas ($N_2$) or helium gas (He), monosilane, dichlorosilane and ammonia gas each flow into a quartz chamber 12 via valves 15a, 15b, 15c, 15d and 15e, and the residual gas within the quartz chamber 12 is exhausted by means of a vacuum pump 14 via a valve 16. Etching by the chlorine trifluoride gas is implemented by opening only the valves 15a, 15b and 16 after the semiconductor substrate processed in a predetermined manner is put into the quartz chamber 12, to reduce the pressure within the quartz chamber 12 retained at a predetermined temperature by means of the vacuum pump 14.

Next, when the polycrystalline silicon film, for example, is deposited on the semiconductor substrate, the valve 15a is closed and the interior of the quartz chamber 12 is heated to several hundred degrees Centigrade by means of a heating lamp 12 under a predetermined reduced pressure and the valve 15c is opened to form a polycrystalline silicon film by thermal decomposition of the monosilane. If the silicon nitride film is deposited in place of the polycrystalline silicon film, the valves 15d and 15e are opened in place of the valve 15c to form a silicon nitride film by gas phase chemical reaction between the dichlorosilane and the ammonia gas.

The film forming unit as illustrated in FIG. 6 is of multichamber type, which is provided seperately with a pre-treatment chamber 38 for conducting the etching by the chlorine trifluoride gas (ClF$_3$), an oxidizing chamber 39a for conducting the thermal oxidization and a sputtering chamber 39b for conducting the sputtering of metallic film.

When the gate oxide film is formed on the semiconductor substrate processed in a predetermined manner, the semiconductor substrate is put into an interlocking chamber 37a via a gate valve 39a and, after the interior of the interlocking chamber 37a is converted into the inert atmosphere, it is put into a transfer chamber 37b retained within the inert atmosphere. Next, after the interior of the pre-treatment chamber 38 is converted into the inert atmosphere, the semiconductor substrate is put into the pre-treatment chamber 38 via the gate valve 36a, and under a predetermined temperature and reduced pressure, it is etched by the chlorine trifluoride gas (ClF$_3$) diluted to a predetermined density, for example, by argon gas. After the etching is completed, the interior of the pre-treatment chamber 38 is converted again into the inert atmosphere and the semiconductor substrate is put into the transfer chamber 37b via the gate valve 36a. Next, after the interior of the oxidizing chamber 39a retained to a predetermined high temperature is converted into the inert atmosphere, the semiconductor substrate is put into the oxidizing chamber 39a via the gate valve 36b to implement thermal oxidization. After the thermal oxidization is completed, the interior of the oxidizing chamber 39a is converted again into the inert atmosphere and the semiconductor substrate is put into the transfer chamber 37b via the gate valve 36b. Further, after the interior of the interlocking chamber 37a is converted again into the inert atmosphere, the semiconductor substrate is put into the interlocking chamber 37a via the gate valve 35b to take out of the film forming equipment via the gate valve 35a.

Further, when the tungsten film, for example, is formed on the semiconductor substrate processed in a predetermined manner, the processes to be followed are the same up to the transfer of the substrate to the transfer chamber 37b after etched within the pre-treatment chamber 38, as in the foregoing process of forming the gate oxide film. After the pressure of the transfer chamber 37b is reduced to the order of the pressure prevailing within the sputtering chamber 39b and the interior of the sputtering chamber 39b is converted into the inert atmosphere, the semiconductor substrate is put into the sputtering chamber 39b via the gate valve 36c to form the tungsten film. Next, the interior of the sputtering chamber 39b is converted again into the inert atmosphere and, after the pressure within the transfer chamber 37b is reduced to the order of the pressure prevailing within the sputtering chamber 39b, the semiconductor substrate is put into the transfer chamber 37b via the gate valve 36c. The following operations are the same as those of the gate oxide film forming process.

Next, a first example of the method of the present invention is described. FIGS. 7A through 7D are respectively a cross-sectional view of the first example of the method of the present invention, in which the processes are illustrated in the order in which they are to be implemented.

Figure 7A:
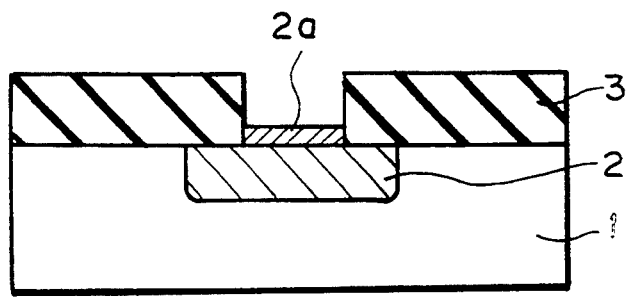
FIGS. 7A through 7D are respectively a cross-sectional view of a first example of the method according to the present invention.

As illustrated in FIG. 7A, an n$^+$-type diffusion layer 2 is selectively formed on the surface of a p-type silicon substrate 1. Further, an insulating film 3 having the thickness of about 0.5 through 1.0 μm, which comprises, for example, a silicon oxide film, is formed on the entire p-type silicon substrate 1 including the n$^+$-type diffusion layer 2. Further, a contact hole reaching the diffusion layer 2 is formed through the insulating film 3 by plasma etching with the photoresist (not shown) as the mask, and this photoresist is removed by ashing by oxygen plasma. At this time, a surface layer 2a having the thickness of about 2 through 5 nm is formed on the surface of the diffusion layer 2 exposed at the contact hole. This surface layer 2a is mainly comprised of a naturally oxidized film, to which damages caused by the plasma etching as the contact hole is formed and by the plasma ashing as the photoresist is removed are imparted. The surface layer 2a contains the heavy metals as added when the contact hole is formed and the contaminated substances such as the hydrocarbon polymer and the like as added when the photoresist is removed.

Figure 7B:
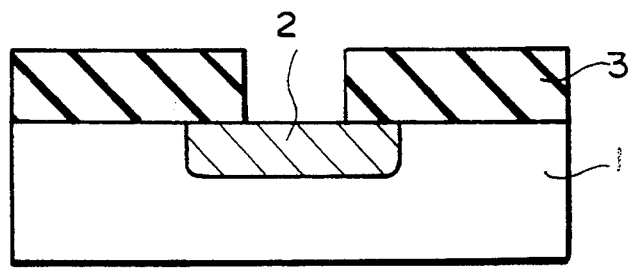

Next, as illustrated in FIG. 7B, within the film forming equipment as illustrated in FIG. 5, the surface layer 2a is removed by etching by chlorine trifluoride gas. The operating method is as the foregoing. This etching is carried out for a few minutes under the reduced pressure below several Torrs at the room temperature by using the chlorine trifluoride gas diluted to several % by volume by, for example, argon gas. At this time, the etching rate relative to the silicon corresponds to about 1 through 3 nm/min. The rate at which the silicon oxide film is etched by the chlorine trifluoride gas is sufficiently small relative to the rate at which the silicon is etched, but the rate at which the surface layer 2a is etched becomes about one fourth through half as large as the rate at which the silicon is etched because the naturally oxidized film constituting the surface layer 2a is not the perfect SiO$_2$ and its fineness is also inferior to the silicon oxide film. From the foregoing, it is obvious that this etching allows the surface layer 2a to be etched while also allowing the silicon on the surface of the diffusion layer 2 to be etched.

Figure 7C:
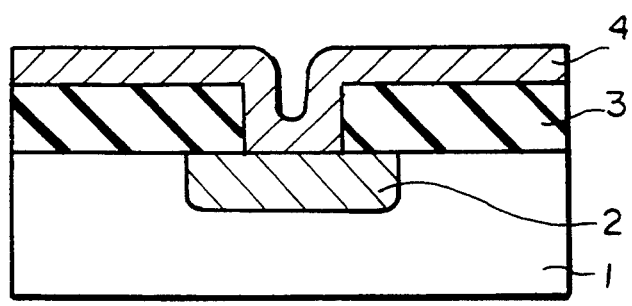

Next, as illustrated in FIG. 7C, within the film forming equipment of FIG. 5, by the foregoing operation, a polycrystalline silicon film 4 having the thickness of about 0.5 μm is formed on the insulating film 3 and the inner surface of the contact hole by thermal decomposition reaction of the monosilane with the nitrogen gas as carrier gas. Next, it is taken out of the film forming equipment to turn the polycrystalline silicon film 4 into the n$^+$-type by thermal diffusion of the phosphor or the like.

Figure 7D:
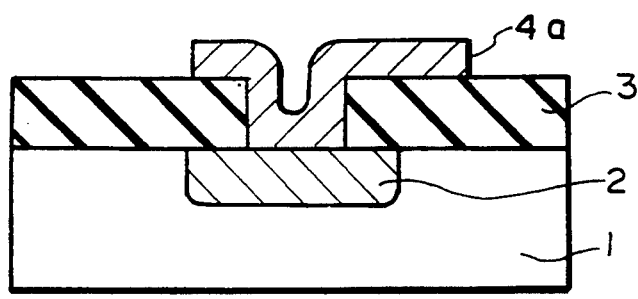

Next, as illustrated in FIG. 7D, the polycrystalline silicon film 4 is etched by the photolithography process to form a polycrystalline silicon interconnection 4a.

In this example, the insulating film 3 formed on the n$^+$− type diffusion layer 2 and the p-type silicon substrate 1 are etched to form a contact hole reaching the n$^+$-type diffusion layer 2. A surface layer is formed on the surface of the n$^+$-type diffusion layer 2 exposed at this time. Prior to formation of the polycrystalline silicon film 4 connected to the exposed surface of the n$^+$- type diffusion layer 2, the foregoing surface layer is removed by the chlorine trifluoride gas within the film forming equipment and, thereafter, the film formation is carried out by the same film forming equipment. In consequence, there is no surface layer interposed between the n+-type diffusion layer 2 and the polycrystalline silicon film 4. As a result, the increase of the contact resistance and the reduction of the long-term reliability caused by the interposed surface layer can be avoided.

Figure 8:
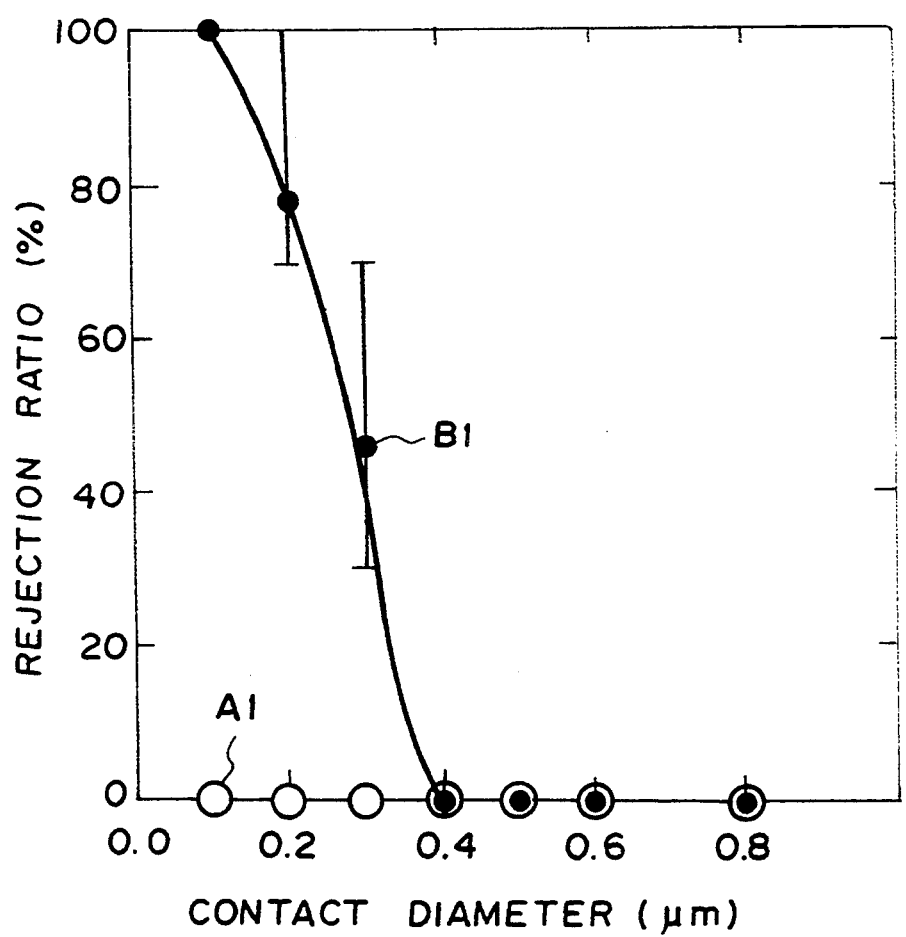
FIG. 8 is a graphic view illustrating a relationship between the contact diameter and the rejection ratio in the first example of the method according to the present invention.

FIG. 8 is a graphic view illustrating a relationship between the contact diameter and the rejection ratio, the former being plotted along the horizontal axis and the latter being plotted along the vertical axis. Referring to FIG. 8, A1 is the measured value obtained by the semiconductor device made according to the first example of the present invention, and B1 is the measured value obtained by the semiconductor device according to the conventional method, in which, when the contact resistance is greater than 1K $\Omega$/piece, it is determined to be defective. As illustrated in FIG. 8, in the semiconductor device obtained according to the conventional method, if the contact diameter becomes smaller than 0.4 $\mu$m, then the rejection ratio is increased, but for one obtained according to this example, no defective article is generated. From this, it is understood that, according to the method of this example, the surface layer of the diffusion layer 2 is completely removed, the increase of the contact resistance is inhibited and an excellent contact hole is formed. Further, the damage and the contaminated substances imparted as the contact hole is formed are also removed by removal of the surface layer 2a with the result that the contact hole free of the contact leak current can be formed.

Next, the method of manufacturing semiconductor device according to a second example of the present invention is hereinafter described.

Figure 9A:
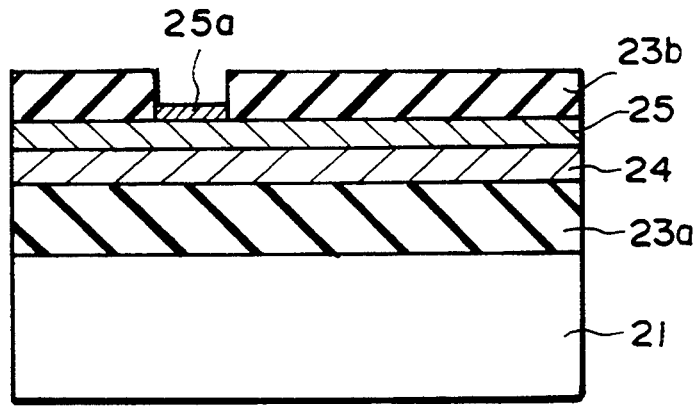
FIGS. 9A through 9C are respectively a cross-sectional view of a second example of the method according to the present invention.
Figure 9B:
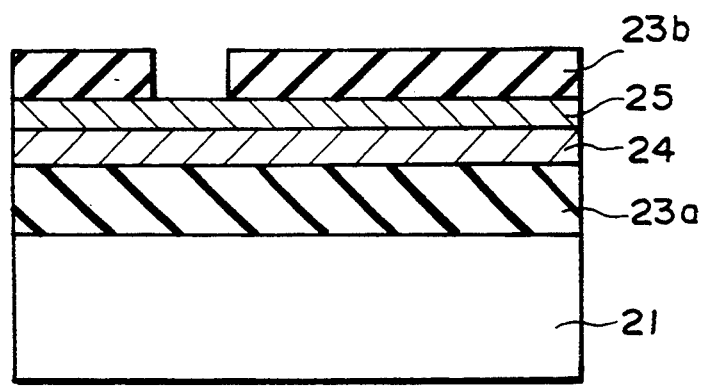
Figure 9C:
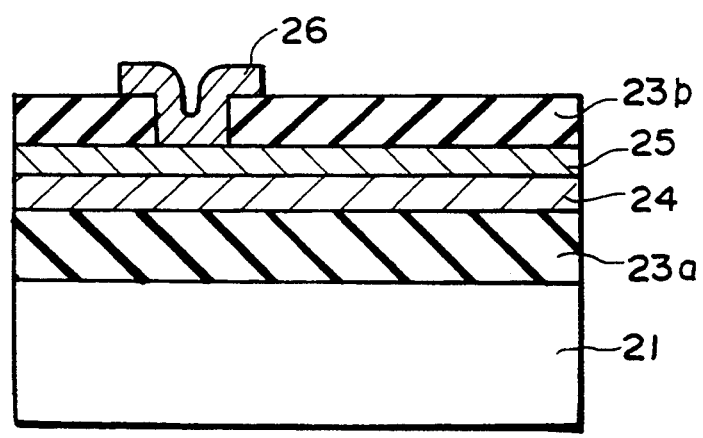

FIGS. 9A through 9C are respectively a cross-sectional view of the method according to the second example of the present invention, which illustrates the processes to be followed in those order.

As illustrated in FIG. 9A, an insulating film 23a having the thickness of about 0.5 through 1.0 $\mu$m, which comprises, for example, a silicon oxide film, is formed on the surface of a p-type silicon substrate 21 and, further, on this insulating film 23a, an n+-type polycrystalline silicon film 24 having the thickness of about 0.1 through 0.2 $\mu$m is formed on this insulating film 23a. Next, on this n+-type polycrystalline silicon film 24, a tungsten silicide film 25 having the thickness of about 0.1 through 0.2 $\mu$m is formed on this n+-type polycrystalline silicon film 24 by sputtering. These are patterned to form a lower layer interconnection comprising the n+-type polycrystalline silicon film 24 and the tungsten silicide film 25. Next, on this tungsten silicide film 29, an insulating film 23b having the thickness of about 0.5 $\mu$m, which comprises, for example, a silicon oxide film, is formed, a through hole reaching the tungsten silicide film 25, is formed through the insulating film 23b by plasma etching with a photoresist (not shown) as the mask and the photoresist is removed by ashing by oxygen plasma. At this time, on the surface of the tungsten silicide film 25 exposed at the through hole, a surface layer 25a having the thickness of about 2 through 5 nm is formed. This surface layer 25a is the naturally oxidized film mainly comprising the silicon oxide film, as in the surface layer 2a of FIG. 7A, and the surface layer 25a undergoes damage and contains the contaminated substances such as the heavy metal, the hydrocarbon polymer and the like.

Next, as illustrated in FIG. 9B, within the pre-treatment chamber 38 of the film forming equipment of FIG. 6, the surface layer 25a is removed by etching using the chlorine trifluoride gas in accordance with the foregoing operating method. This etching condition is approximately the same as the etching condition in the method according to the first example of the present invention. Next, within the sputtering chamber 39b of the film forming equipment of FIG. 6, a metallic film having the thickness of about 0.5 $\mu$m, which comprises, for example, an aluminum film, is formed on the entire surface according to the foregoing operation.

Next, as illustrated in FIG. 9C, one having this metallic film formed is taken out of the film forming equipment to etch the metallic film according to the photolithography process to form the upper layer interconnection 26.

Also in this example, as in the first example, the tungsten silicide film 25 is exposed by etching of the insulating film 23b and, prior to formation of the film of the upper layer interconnection 26 comprising the metallic film connected to this exposed tungsten silicide film 25, the surface layer 25a is removed by the chlorine trifluoride gas within the film forming equipment. Thereafter, the film is formed by means of the same film forming equipment. Therefore, there is no surface layer 25a interposed between the tungsten silicide film 25 and the upper layer interconnection 26. As a result, the increase of the contact resistance and the reduction of the long-term reliability caused by the interposed surface layer can be avoided.

In this manner, in this example, as in the first example, the increase of the contact resistance is suppressed and an excellent through hole can be obtained and, especially the deterioration of the long-term reliability caused by the contamination by the heavy metal can also be avoided.

Next, the method according to a third example of the present invention is described. FIGS. 10A through 10D are respectively a cross-sectional view of the method according to the third example of the present invention, which illustrates the processes in those order. FIG. 11 is a graphic view illustrating the reduced thickness of the silicon oxide film relative to the thickness of the deposited silicon nitride film in the method according to the third example of the present invention. This example relates to the method of forming a capacitor dielectric in a DRAM.

Figure 10A:
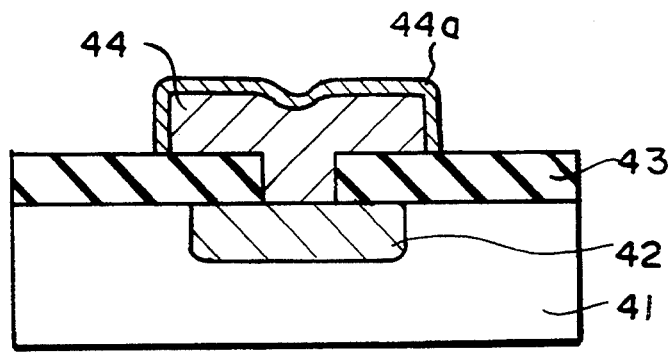
FIGS. 10A through 10D are respectively a cross-sectional view of a third example of the method according to the present invention.
Figure 11:
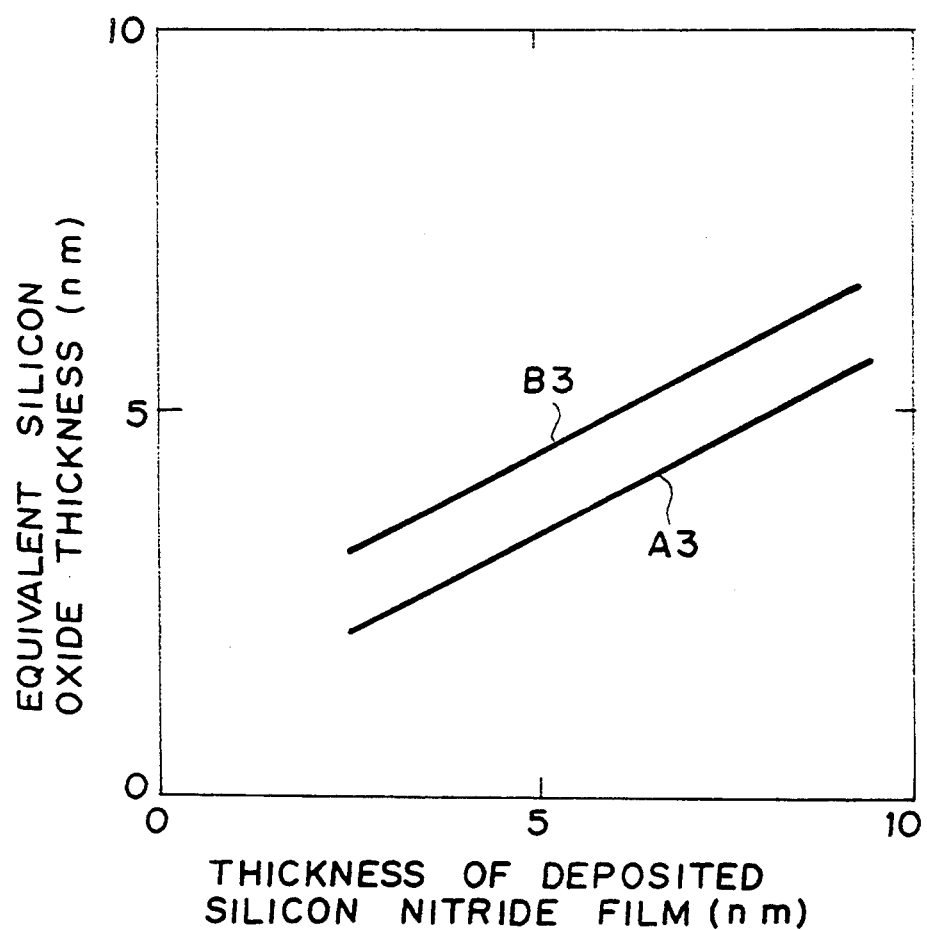
FIG. 11 is a graphic view illustrating a relationship between the thickness of the deposited silicon nitride film and the equivalent silicon oxide thickness in the third example of the method according to the present invention.

First, as illustrated in FIG. 10A, an n+-type diffusion layer 2 is selectively formed on the surface of a p-type silicon substrate 41. Next, on the p-type silicon substrate 41 including this n+-type diffusion layer 42, an insulating film 43 having the thickness of about 0.5 through 0.7 $\mu$m, which comprises, for example, a silicon oxide film, is formed. Further, a contact hole reaching the diffusion layer 42 is formed through the insulating film 43 and the polycrystalline silicon film (not shown) having the thickness of about 0.4 $\mu$m is formed by the thermal decomposition reaction of the monosilane using the LPCVD equipment. Next, it is taken out of the LPCVD equipment and, by the thermal diffusion of the phosphor or the like, the polycrystalline silicon film is turned into the n+-type, the polycrystalline silicon film is etched by plasma etching with the photoresist (not shown) as the mask, and the photoresist is removed by ashing by the oxygen plasma to form a storage node electrode 44 comprising the polycrystalline silicon film. At this time, on the surface of the storage node electrode 44, a surface layer 44a having the thickness of about 2 through 5 nm is formed. The surface layer 44a mainly comprises a naturally oxidized film, as in the surface layer 2a of FIG. 7A, and is damaged and contains the contaminated substances such as the heavy metal, hydrocarbon polymer and the like.

Figure 10B:
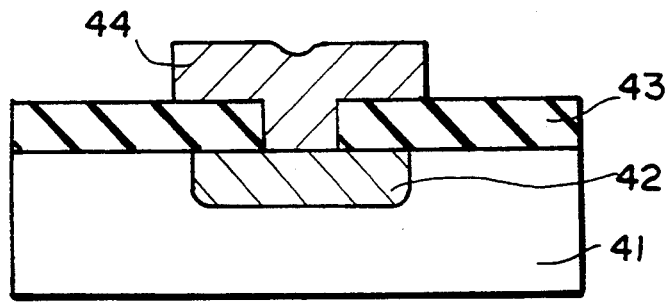

Next, as illustrated in FIG. 10B, within the film forming equipment of FIG. 5, the surface layer 44a is removed by etching using the chlorine trifluoride gas in accordance with the foregoing operating method. This etching condition is approximately the same as the etching condition in the method according to the first example of the present invention.

Figure 10C:
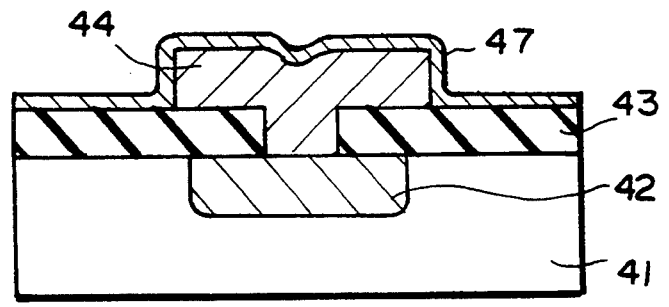

Next, as illustrated in FIG. 10C, the foregoing operation is subsequently carried out within the film forming equipment illustrated in FIG. 5, and a silicon nitride film 47 having the thickness of about 2 through 5 nm is, formed on the entire surface by the gas phase chemical reaction between the dichlorosilane and the ammonia gas with the nitrogen gas as the carrier gas.

Figure 10D:
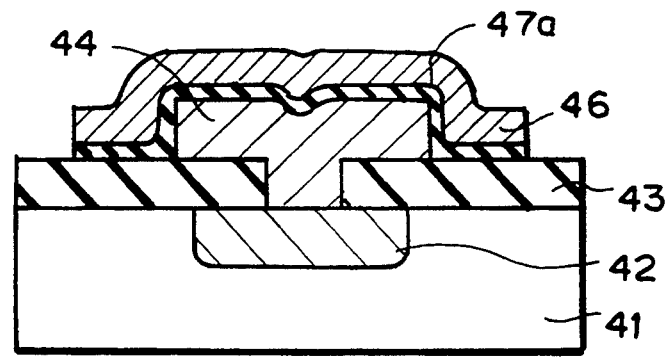

As illustrated in FIG. 10D, within the same film forming equipment, according to the foregoing operation, a polycrystalline silicon film having the thickness of about 0.2 through 0.3 $\mu$m is formed by the thermal decomposition reaction of the monosilane with the nitrogen gas as the carrier gas. Subsequently, it is taken out of the film forming equipment, and the polycrystalline silicon film is turned into the n+-type by the thermal diffusion of the phosphor or the like. Next, the etching of the polycrystalline silicon film and the silicon nitride film 47 are carried out according to the photolithography process, and a plate electrode 46 comprising the polycrystalline silicon film and a capacitor dielectric 47a comprising the silicon nitride film 47 are formed.

In this example, as in the first and second examples, prior to formation of the silicon nitride film 47 connected to the storage node electrode 44, the surface layer 44a is removed by the chlorine trifluoride gas within the film forming unit and, thereafter, the silicon nitride film 47 is formed by means of the same film forming unit. Therefore, there is no surface layer 44a interposed between the storage node electrode 44 and the silicon nitride film 47. As a result, the increase of the contact resistance and the reduction of the long-term reliability caused by the interposed surface layer 44a can be avoided.

Figure 3A:
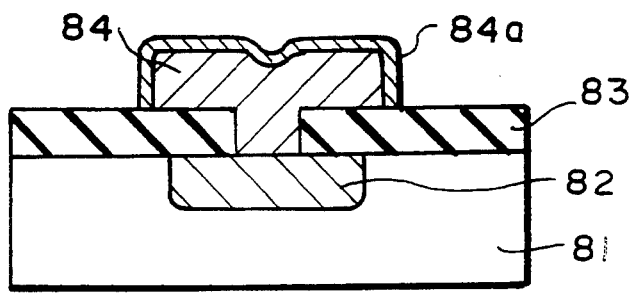
FIGS. 3A through 3C are respectively a cross-sectional view illustrating the conventional method of manufacturing semiconductor device in the order of the processes to be followed.
Figure 3B:
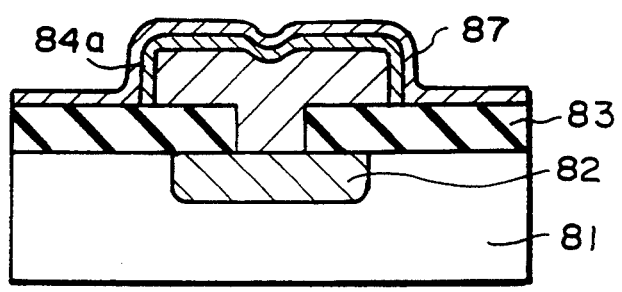
Figure 3C:
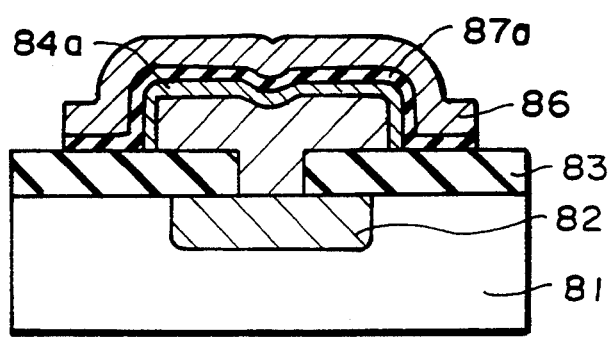

Referring to FIG. 11, A3 is the measured value of the semiconductor device obtained according to the method of this example, and B3 is the measured value of the semiconductor device obtained according to the conventional method (see FIGS. 3A through 3C). As apparent from FIG. 11, in this example, since the surface layer 44a is removed, the equivalent silicon oxide film relative to the thickness of the deposited silicon nitride film is smaller by about 1 nm than in the conventional method. Therefore, the semiconductor device obtained according to the method of this example can become to have a large capacitance. Further, the damage and the presence of the contamination, which serves as the cause for the degradation of the reliability such as the inferior voltage-proof performance or the increase of the leak current of the capacitor dielectric can be eliminated.

Next, the method according to a fourth example of the present invention is described. FIGS. 12A through 12D are respectively a cross-sectional view of the method according to the fourth example of the present invention, which illustrates the processes to be followed in those order. FIG. 13 is a graphic view illustrating a TDDB (Time Dependent Dielectric Breakdown) cumulation failure relative to the stress time in the method according to the fourth example of the present invention. This example relates to a method of forming a gate insulating film.

Figure 12A:
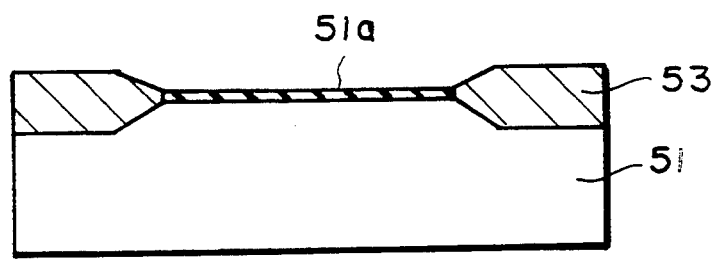
FIG. 12A through 12D are respectively a cross-sectional view illustrating a fourth example of the method according to the present invention, which is illustrated in the order of the processes followed.
Figure 13:
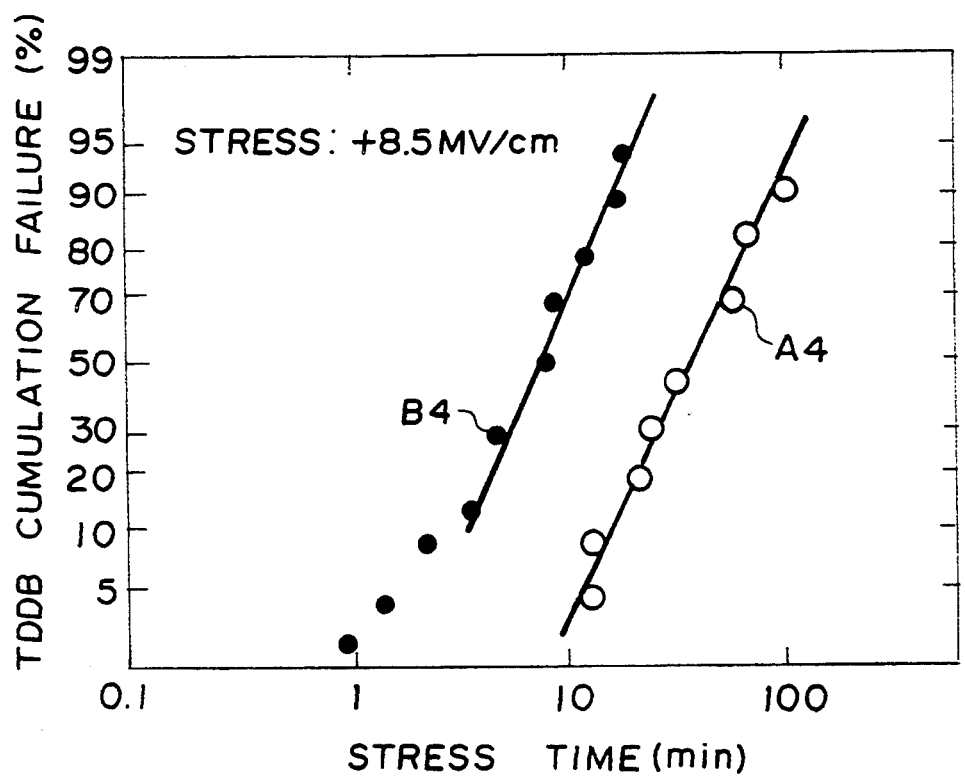
FIG. 13 is a graphic view of a relationship between the stress time and TDDB cumulation failure in the fourth example of the method according to the present invention.

First, as illustrated in FIG. 12A, a pad oxide film (not shown) and a silicon nitride film (not shown) are formed on the surface of a p-type silicon substrate 51, a field oxide film 53 having the thickness of about 0.8 through 0.8 $\mu$m is formed according to the known selective oxidizing method, and the silicon nitride film and the pad oxide film are removed by etching to expose the surface of the silicon substrate 51 at the part, which serves as an area for forming the element. At this time, a surface layer 51a is formed on the surface of the exposed silicon substrate 51. This surface layer 51a has the thickness of about 2 nm and contains the contaminated substances such as carbon compound and the like.

Figure 12B:
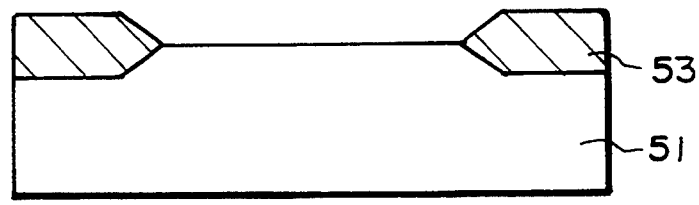
Figure 12C:
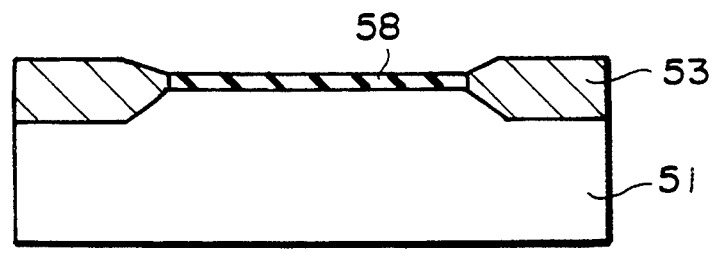

Next, as illustrated in FIG. 12B, within the pre-treatment chamber 38 of the film forming equipment of FIG. 6, the foregoing operating method is carried out to remove the surface layer 51a by etching by the chlorine trifluoride gas. This etching condition is approximately the same as that of the method according to the first example of the present invention.

Figure 12D:
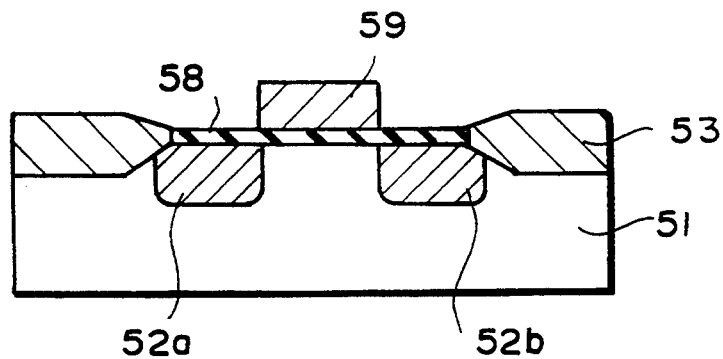

Next, as illustrated in FIG. 12D, within the oxidizing chamber 39a of the film forming equipment of FIG. 6, a gate insulating film 58 having the thickness of about 15 nm, which comprises a silicon oxide film, is formed on the exposed surface of the silicon substrate 51 according to the foregoing operation. At this time, on the surface of the gate insulating film 58, unlike the conventional method, no pit-shaped cavity is formed.

Next, as illustrated in FIG. 12D, the article is taken out of the film forming equipment of FIG. 6, and a gate electrode 59 comprising the n+-type polycrystalline silicon film and the n+-type diffusion layers 52a, 52b serving as the source and drain areas respectively are formed to form a MOS transistor.

In this example, as in the first, second and third examples, prior to the formation of the gate insulating film 58 connected to the p-type silicon substrate 51 exposed by etching, the surface layer 51a is removed by the chlorine trifluoride gas within the film forming equipment and, thereafter, the gate insulating film 58 is formed by means of the same film forming equipment. Therefore, there is no surface layer 51a interposed between the p-type silicon substrate 51 and the gate insulating film 58. As a result, the increase of the contact resistance and the reduction of the long-term reliability, which are caused by the interposed surface layer, can be avoided.

Figure 4:
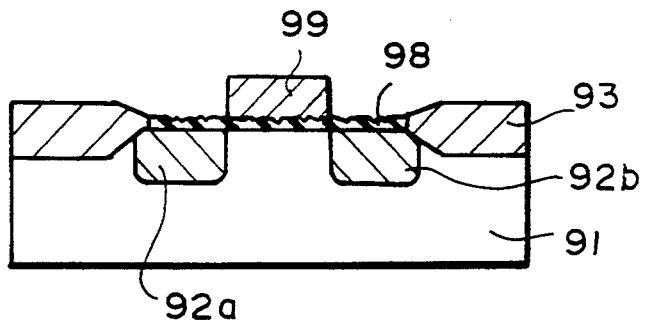
FIG. 4 is a cross-sectional view of a process in the conventional method of manufacturing semiconductor device.

Referring to FIG. 13, A4 is the measured value of the semiconductor device obtained according to this example, and B4 is the measured value of the same according to the conventional method (see FIG. 4). For both the semiconductor devices according to the method of this example and the conventional method, measurement was conducted to a capacitor structure comprising a silicon substrate, gate insulating film and gate electrode formed according to each method. The electric field for applying stress was 8.5 MV/cm. The time dependence of the failure factor, which is obtained by the measurement of TDDB, as apparent from the same figure, demonstrates that, in this example, the lifetime is prolonged about 1 digit as compared with the conventional method. This is because the gate insulating film 58 is formed after the surface layer 51a including the damage, naturally oxidized film and the like are removed.

Incidentally, the film forming equipment of FIG. 5 is one for etching by the chlorine trifluoride gas, forming the polycrystalline silicon film and the silicon nitride film within the same chamber, but the kind and combination of the methods of forming the film are not restricted to this.

Further, the film forming equipment of FIG. 6 is one having the oxidizing chamber and the sputtering chamber, but the kind and combination of the method of forming film is not restricted to this.

Further, for the metallic film serving as the upper layer interconnection 26 of FIG. 9C, the aluminum film is used, but is not exclusive and the metallic film such as the tungsten film or the like can also be used.

As described above, according to the present invention, various disadvantages caused by the interposed surface layer including the naturally oxidized film, damage, contaminated substances or the like, such as the increase of the contact resistance, reduction of the capacity value, increase of the leak current and reduction of the voltage-proof performance, can be avoided.

What is claimed is:

1. A method of manufacturing semiconductor devices comprising the steps of:

forming an insulating film on a surface of an electric conductor lying on a semiconductor substrate;

removing a part of the insulating film by etching to expose a part of a surface of the electric conductor;

removing by chlorine trifluoride gas both a naturally oxidized film and a surface layer of the exposed part of the electric conductor, the surface layer including possible damage and contaminated substances caused by said etching, said contaminated substances comprising heavy metals and hydrocarbon polymers; and forming a film connected to the electric conductor on at least the exposed part of the surface thereof.

2. The method as set forth in claim 1 wherein said etching is done by plasma etching.

3. A method as set forth in claim 1 wherein the step of removing said surface layer by the chlorine trifluoride gas and the step of forming a film connected to said electric conductor are carried out within the same apparatus.

4. Method as set forth in claim 1 wherein said insulating film lies between a semiconductor and an interconnection layer.

5. Method as set forth in claim 1 wherein said insulating film lies between interconnection layers.

6. Method as set forth in claim 1 wherein said insulating film comprises a capacitor dielectric.

7. Method as set forth in claim 1 wherein said insulating film comprises a field oxide film of the semiconductor.

8. A method as set forth in claim 1 wherein said film connected to said electric conductor is an electrically conductive film.

9. A method as set forth in claim 1 wherein said film connected to said electric conductor is an insulation film.

10. Method as set forth in claim 9 wherein said film connected to said electric conductor comprises a gate insulating film of a MOS transistor.

* * * * *